United States Patent [19]
Sato

[11] Patent Number: 5,939,733
[45] Date of Patent: Aug. 17, 1999

[54] COMPOUND SEMICONDUCTOR DEVICE HAVING A GROUP III-V COMPOUND SEMICONDUCTOR LAYER CONTAINING THEREIN Tl AND AS

[75] Inventor: Shunichi Sato, Miyagi, Japan

[73] Assignee: Ricoh Company, Ltd., Tokyo, Japan

[21] Appl. No.: 08/920,054

[22] Filed: Aug. 29, 1997

[30] Foreign Application Priority Data

Aug. 30, 1996 [JP] Japan ................................. 8-246977

[51] Int. Cl.⁶ .................................................. H01L 33/00
[52] U.S. Cl. ............................. 257/94; 257/96; 257/97; 257/103; 257/201; 372/44; 372/45; 372/46
[58] Field of Search ............................ 257/94, 96, 97, 257/103, 201; 372/44, 45, 46

[56] References Cited

U.S. PATENT DOCUMENTS

| | | | |
|---|---|---|---|
| Re. 29,009 | 10/1976 | Jeffers ............................. | 73/88.55 D |
| 3,849,874 | 11/1974 | Jeffers ............................. | 29/590 |
| 4,512,638 | 4/1985 | Sriram ............................. | 350/372 |
| 5,483,088 | 1/1996 | Chen et al. ..................... | 257/189 |

FOREIGN PATENT DOCUMENTS 6-37355 of 1994 Japan.
07193327 of 1995 Japan.

OTHER PUBLICATIONS

Asahi, et al. "New III–V Compound Semiconductors TlIn-GaP for 0.9 um to over 10 um Wavelength Range Laser Diodes and Their First Successful Growtn" (Jpn. J. Appl. Phys. vol 35 (1996), Part 2, No. 7B Jul 15, 1996, pp. L876–L879).

*Primary Examiner*—William Mintel
*Attorney, Agent, or Firm*—Dickstein Shapiro Morin & Oshinsky LLP

[57] ABSTRACT

A compound semiconductor device includes a substrate and a group III-V compound semiconductor layer provided on the substrate, wherein the group III-V compound semiconductor layer contains As as a group V element and Tl as a group III element.

11 Claims, 4 Drawing Sheets

COMPOUND SEMICONDUCTOR DEVICE HAVING A GROUP III-V COMPOUND SEMICONDUCTOR LAYER CONTAINING THEREIN T1 AND AS

BACKGROUND OF THE INVENTION

The present invention generally relates to compound semiconductor devices and more particularly to an improvement of a group III-V compound optical semiconductor device for use in optical telecommunication, such as a laser diode or a photodiode. Further, the present invention relates also to an improvement of a high-speed group III-V compound semiconductor device.

Today, a telecommunication trunk generally uses an optical telecommunication system in which optical fibers are used for carrying information traffic in the form of optical signals. Currently, quartz glass optical fibers having an optical transmission band of 1.3 $\mu$m or 1.5 $\mu$m wavelength are used commonly. In correspondence to the foregoing specific transmission band of the optical fibers, current optical telecommunication systems generally use a GaInAsP double-heterojunction laser diode that includes an active layer of $In_{1-x}Ga_xAs_yP_{1-y}$ and a cladding layer of InP. In such a GaInAsP double-heterojunction laser diode, the carriers are accumulated in the active layer by a potential barrier formed in the conduction band and the valence band between the GaInAsP active layer and the InP cladding layer, and stimulated emission of photons is substantially facilitated in the active layer by the carriers thus accumulated therein. In order to obtain a laser oscillation at the wavelength that matches the optical transmission band of the quartz glass optical fibers, the compositional parameter x for Ga and the compositional parameter y for As are adjusted appropriately in the foregoing GaInAsP laser diode.

However, such a conventional laser diode that uses a double-heterojunction structure of GaInAsP and InP for the accumulation of carriers has suffered from the problem of relatively large threshold current of laser oscillation and poor temperature characteristic, primarily due to the relatively small band discontinuity ($\Delta Ec$) of the conduction band between the GaInAsP active layer and the InP cladding layer. More specifically, the electrons escape easily from the active layer in such an GaInAsP laser diode because of the small potential barrier $\Delta Ec$ formed by the foregoing band discontinuity, and a large drive current has to be supplied in order to sustain a laser oscillation in the active layer. This problem becomes particularly acute at high temperatures in which the carriers experience an increased degree of thermal excitation. Further, the foregoing GaInAsP laser diode has a problem in that the laser oscillation wavelength tends to shift to a longer wavelength side at high temperatures due to the temperature dependence of the bandgap of GaInAsP. It should be noted that the bandgap of GaInAsP decreases with temperature. This shift of the laser oscillation wavelength raises a serious problem particularly in a wavelength multiplex transmission process of optical signals.

In order to avoid the foregoing problems, conventional GaInAsP double-heterojunction laser diodes for use in optical telecommunication trunk or submarine optical cable systems have used a temperature regulation device, such as a Peltier cooling device, such that the operational temperature of the laser diode is maintained at a predetermined temperature.

On the other hand, there is a strong impetus to expand the use of optical telecommunication technology not only in the telecommunication trunks but also to subscriber systems. In relation to this, there is a demand for optical semiconductor devices suitable for use in home terminals.

When realizing such optical home terminals, it is essential that the optical home terminal is compact and low cost. Further, the optical home terminal should consume little electric power. In order to meet such demands, it is necessary to provide a laser diode that is operable in the 1.3 or 1.5 $\mu$m band with a low threshold current, but without a temperature regulation.

As long as the foregoing GaInAsP/InP double-heterojunction system is used, the foregoing demand cannot be satisfied. Thus, efforts are being made to construct a laser diode having an active layer of GaInAs on a GaAs substrate such that a large band discontinuity $\Delta Ec$ is secured in the conduction band. By increasing the In content in the GaInAs active layer, it is possible to reduce the bandgap energy Eg of the active layer, and the oscillation wavelength of the laser diode approaches the desired 1.3 $\mu$m band. However, such an increase of the oscillation wavelength by increasing the In content in the GaInAs active layer is successful only to the point in which the oscillation wavelength reaches about 1.1 $\mu$m. Beyond that, the lattice misfit between the GaInAs active layer and the GaAs substrate becomes excessive and the epitaxial growth of the GaInAs active layer is no longer possible on the GaAs substrate. It should be noted that the foregoing limit of 1.1 $\mu$m takes into consideration the contribution of strain that acts in the direction to increase the oscillation wavelength of the laser diode.

In view of the foregoing situation, Japanese Laid-Open Patent Publication 7-193327 proposes a laser diode operable in the 1.3 or 1.5 $\mu$m band, in which an active layer of GaInAs is sandwiched by a pair of cladding layers having a composition set such that a large band discontinuity $\Delta Ec$ is secured between the active layer and the cladding layer and that the cladding layer has simultaneously a lattice constant close to that of a strained buffer layer provided on a GaAs substrate with a composition of $Ga_{0.8}In_{0.2}As$. However, the proposed device is deemed to be unrealistic in view of the large lattice misfit between the active layer and the GaAs substrate. It is believed that the existence of such a large lattice misfit reduces the lifetime of the laser diode substantially.

On the other hand, Japanese Laid-Open Patent Publication 6-37355 describes a compound semiconductor structure that includes a GaInNAs mixed crystal film formed on a GaAs substrate. By adding N to GaInAs, it becomes possible to form the GaInNAs film with a lattice constant that matches the lattice constant of GaAs. The GaInNAs film thus added with N has a reduced bandgap due to a large negative bowing of the bandgap-composition relationship observed in a GaAs-GaN system. Thus, it is expected that a double-heterostructure laser diode having an oscillation wavelength in the 1.3 or 1.5 $\mu$m and simultaneously a large band discontinuity $\Delta Ec$ necessary for carrier accumulation, may be obtained by using GaInNAs for the active layer. As the GaInNAs film can have a composition that establishes a lattice matching with GaAs, it is possible to use an AlGaAs cladding in combination with the active layer of GaInNAs. However, it should be noted that the GaInNAs mixed crystal system includes a large miscibility gap therein and the quality of the GaInNAs crystal thus obtained tends to be deteriorated when the N content and hence the laser oscillation wavelength are increased.

Further, there is a proposal to use an active layer of GaInTlP in a laser diode constructed on an InP substrate (Asahi, H., et al., Jpn. J. Appl. Phys. vol.35, pp.L876–L879, Part 2, No.7B, Jul. 15, 1996). It should be noted that TlP is a semi-metal having a negative bandgap and a lattice constant of about 0.6 nm, wherein this value of the lattice constant is about 3% larger than InP. Further, the bandgap of TlP widens with increasing temperature, contrary to a semiconductor material such as InP, in which the bandgap narrows with increasing temperature. Thus, by mixing InP and TlP with a suitable ratio, it is expected that a mixed crystal composition of InTlP is obtained in which the bandgap does not change substantially with temperature. Further, the active layer thus containing Tl may further contain Ga. In this case, the active layer has a composition of GaInTlP and establishes a lattice matching with an InP substrate.

While GaInTlP noted above is indeed a promising material for increasing the laser oscillation wavelength, the laser diode that uses GaInTlP for the active layer still suffers from the problem of poor carrier accumulation in the active layer and hence poor temperature characteristic, due to the use of an InP cladding layer. It should be noted that a cladding layer, having a substantial thickness, has to satisfy the requirement of lattice matching with the substrate, which in this case is InP. As long as InP is used for the cladding layer, the band discontinuity ΔEc between the GaInTlP active layer and the InP cladding layer is relatively limited.

SUMMARY OF THE INVENTION

Accordingly, it is a general object of the present invention to provide a novel and useful compound semiconductor device wherein the foregoing problems are eliminated.

Another and more specific object of the present invention is to provide an optical semiconductor device having an active layer interacting with an optical beam guided through an optical fiber having an optical transmission band of 1.3 $\mu$m or 1.5 $\mu$m, wherein a large band discontinuity is secured between the active layer and a cladding layer provided adjacent to the active layer.

Another object of the present invention is to provide a compound semiconductor device, comprising:

a substrate; and a group III-V compound semiconductor layer provided on said substrate, said group III-V compound semiconductor layer containing As as a group V element and Tl as a group III element.

Another object of the present invention is to provide a light-emitting optical semiconductor device, comprising:

a GaAs substrate;

an active layer of a group III-V compound semiconductor layer containing As as a group V element and Tl as a group III element, said active layer being provided on said GaAs substrate;

an upper cladding layer provided on said active layer, said upper cladding layer having a composition selected such that said upper cladding layer establishes a lattice matching with said substrate, said upper cladding layer being selected from a group consisting of: AlGaAs, InGaAsP and InGaP;

a lower cladding layer provided on said GaAs substrate but below said active layer, said lower cladding layer having a composition selected such that said lower cladding layer establishes a lattice matching with said substrate, said lower cladding layer being selected from a group consisting of: AlGaAs, InGaAsP and InGaP;

a first electrode provided on said upper cladding layer for injecting carriers of a first polarity into said active layer via said upper cladding layer; and a lower electrode provided on said GaAs substrate for injecting carriers of a second, opposite polarity into said active layer via said lower cladding layer.

According to the present invention, the temperature-dependent change of bandgap in the active layer is successfully compensated for by incorporating Tl thereinto. The active layer thus containing Tl has a very small bandgap and a large band discontinuity is secured in the conduction band between the active layer and the cladding layer. Thereby, an efficient carrier accumulation is achieved in the active layer and the laser oscillation threshold is reduced substantially even in a high temperature operation of the device. In other words, the light-emitting optical semiconductor device functions as an efficient laser diode operable in the wavelength of the 1.3 $\mu$m or 1.5 $\mu$m band even in a high temperature environment, without using a cooling device. Further, the bandgap of the active layer thus containing Tl and As does not change substantially with temperature, and the problem of temperature-dependent shift of the laser oscillation wavelength is substantially eliminated.

Another object of the present invention is to provide a double-hetero laser diode, comprising:

a GaAs substrate;

an active layer of a group III-V compound semiconductor layer containing As and N as a group V element and Tl as a group III element, said active layer being provided on said GaAs substrate and having a composition set such that a lattice matching is achieved with said GaAs substrate;

an upper cladding layer provided on said active layer in contact therewith, said upper cladding layer having a composition selected such that said upper cladding layer establishes a lattice matching with said substrate, said upper cladding layer being selected from a group consisting of: AlGaAs, InGaAsP and InGaP;

a lower cladding layer provided on said GaAs substrate but below said active layer in contact with said active layer, said lower cladding layer having a composition selected such that said lower cladding layer establishes a lattice matching with said substrate, said lower cladding layer being selected from a group consisting of: AlGaAs, InGaAsP and InGaP;

a first electrode provided on said upper cladding layer for injecting carriers of a first polarity into said active layer via said upper cladding layer; and a lower electrode provided on said GaAs substrate for injecting carriers of a second, opposite polarity into said active layer via said lower cladding layer.

According to the present invention, the active layer has a composition that achieves a lattice matching with the GaAs substrate. Thereby, the thickness of the active layer can be increased arbitrarily and the laser diode can have a double-hetero structure in which the active layer is sandwiched by a pair of cladding layers. By incorporating N into the active layer, it should be noted that the lattice constant of GaTlAs can be reduced successfully while maintaining a very small bandgap. It should be noted that the amount of N needed in the active layer is very small, and the deterioration of crystal quality caused by the incorporation of N into the active layer is avoided successfully.

Another object of the present invention is to provide a vertical-cavity surface-emitting laser diode, comprising:

a GaAs substrate;

a lower multilayer reflector provided on said GaAs substrate, said lower multilayer reflector comprising an alternate repetition of a GaAs layer and an AlGaAs layer;

an active layer of a group III-V compound semiconductor layer containing As as a group V element and Tl as a group III element, said active layer being provided on said lower multilayer reflector;

an upper cladding layer provided on said active layer, said upper cladding layer having a composition selected such that said upper cladding layer establishes a lattice matching with said substrate, said upper cladding layer being selected from a group consisting of: AlGaAs, InGaAsP and InGaP;

a lower cladding layer provided on said lower multilayer reflector but below said active layer, said lower cladding layer having a composition selected such that said lower cladding layer establishes a lattice matching with said substrate, said lower cladding layer being selected from a group consisting of: AlGaAs, InGaAsP and InGaP;

an upper multilayer reflector provided on upper cladding layer, said upper multilayer reflector comprising an alternate repetition of a GaAs layer and an AlGaAs layer;

an upper ohmic electrode provided in electrical contact with said upper cladding layer for injecting carriers of a first polarity to said active layer via said upper cladding layer; and a lower ohmic electrode provided in electrical contact with said lower cladding layer for injecting carriers of a second, opposite polarity to said active layer via said lower cladding layer.

According to the present invention, it is possible to form an efficient optical cavity by using the upper and lower multilayer reflectors formed of an alternate repetition of GaAs and AlGaAs layers. By using the GaAs and AlGaAs layers, it becomes possible to induce a large refractive index change in the first and second multilayer reflectors, while maintaining simultaneously an excellent lattice matching with the GaAs substrate. As a result of the use of the active layer that contains Tl and As, the vertical-cavity surface-emitting laser diode oscillates at the wavelength of 1.3 or 1.5 $\mu$m band while using the GaAs substrate.

Another object of the present invention is to provide a photodiode, comprising:

a substrate of a group III-V compound semiconductor material;

a photo-absorption layer of a group III-V compound semiconductor material containing therein TlAs and N, said photo-absorption layer being provided on said substrate with a lattice matching therewith;

a first electrode provided on said substrate, said first electrode including a window for exposing a surface of said substrate; and a second electrode provided on said photo-absorption layer.

According to the present invention, the photo-absorption layer interacts with an incident optical beam in an optical transmission band of an optical fiber such as the 1.3 $\mu$m band or 1.5 $\mu$m band. As the photo-absorption layer achieves a lattice matching with the substrate, the thickness of the photo-absorption layer can be increased as desired, and an efficient and high-sensitivity optical detection becomes possible.

Another object of the present invention is to provide a high-speed compound semiconductor device that includes an active layer of a group III-V compound semiconductor material containing therein Tl as a group III element.

Another object of the present invention is to provide a high-speed compound semiconductor device, comprising:

a substrate of a group III-V compound semiconductor material;

a channel layer of a group III-V compound semiconductor material containing therein Tl as a group III element and As as a group V element;

source electrode means for injecting carriers into said channel layer;

drain electrode means for collecting carriers from said channel layer; and gate control means controlling a flow of said carriers in said channel layer from said source electrode means to said drain electrode means.

According to the present invention, a two-dimensional electron gas is formed in the channel layer by providing an electron supplying layer adjacent to the channel layer, wherein a large electron density is realized in the two-dimensional electron gas due to a very large band discontinuity between the channel layer containing Tl and the electron supplying layer. Further, the use of the channel layer containing Tl allows the use of GaAs for the electron supplying layer because of the very small bandgap of the Tl-containing III-V material used for the channel layer. Thereby, the quality of the crystal of the electron supplying layer is improved substantially over the conventional case of using AlGaAs that contains Al.

Other objects and further features of the present invention will become apparent from the following detailed description when read in conjunction with the attached drawings.

DETAILED DESCRIPTION OF THE PREFERRED EMBODIMENTS

PRINCIPLE

The present invention uses a group III-V compound semiconductor material that contains As and Tl respectively as a group V element and a group III element, for an active layer of a compound semiconductor material. As TlAs is a semi-metal having a negative bandgap, the incorporation of Tl and As in a conventional group III-V compound semiconductor material, such as GaAs, causes a substantial decrease in the bandgap as compared with a conventional group III-V compound semiconductor material used conventionally for the active layer of an optical semiconductor device, such as InGaAs. Further, the bandgap of TlAs increases with temperature, while this tendency is opposite to the case of conventional group III-V compound semiconductor materials. Thus, by incorporating Tl and As into a conventional group III-V compound semiconductor material with an appropriate amount, it becomes possible to reduce the temperature dependence of the bandgap substantially.

By forming a mixed crystal layer of a group III-V material containing TlAs on a GaAs substrate together with another group III-V compound semiconductor layer having a bandgap larger than that of GaAs, it becomes possible to obtain a novel active device not realized heretofore.

Further, it is possible to form a group III-V material layer having a composition of $Tl_xGa_{1-x}As$ (0<x<1) on a GaAs substrate with a compressive strain. The GaTlAs layer thus formed has a bandgap far smaller than that of an InGaAs layer of the same lattice constant.

Further, by introducing N into the group III-V compound semiconductor layer containing therein TlAs as another group V element, it is possible to reduce the lattice constant of the group III-V compound semiconductor layer substantially. Thereby, the obtained group III-V compound semiconductor layer easily establishes a lattice matching with a GaAs substrate. With regard to the reduction of the bandgap of a group III-V compound semiconductor layer, it should be noted that the amount of N to be introduced into the group III-V compound semiconductor layer is very small, as the group III-V compound semiconductor layer thus containing Tl has already a reduced bandgap. Thereby, the problem of deterioration of film quality caused by the incorporation of N is successfully avoided.

By using a group III-V compound semiconductor layer containing therein As and Tl as the active layer of a laser diode, in combination with a cladding layer of AlGaAs, GaInAsP, or GaInP, the band discontinuity $\Delta Ec$ between the active layer and the cladding layer is increased substantially, and the efficiency of accumulation of the carriers in the active layer is improved. Thereby, the threshold current of laser oscillation is reduced and the efficiency of laser oscillation is improved. As the active layer thus containing Tl and As has a bandgap that does not change substantially with temperature, the oscillation wavelength of the laser diode remains substantially constant even when the operational temperature of the laser diode is changed variously. The bandgap of the active layer can be easily adjusted to match the optical transmission band of an optical fiber by the incorporation of Tl into the active layer.

FIRST EMBODIMENT

Figure 1:
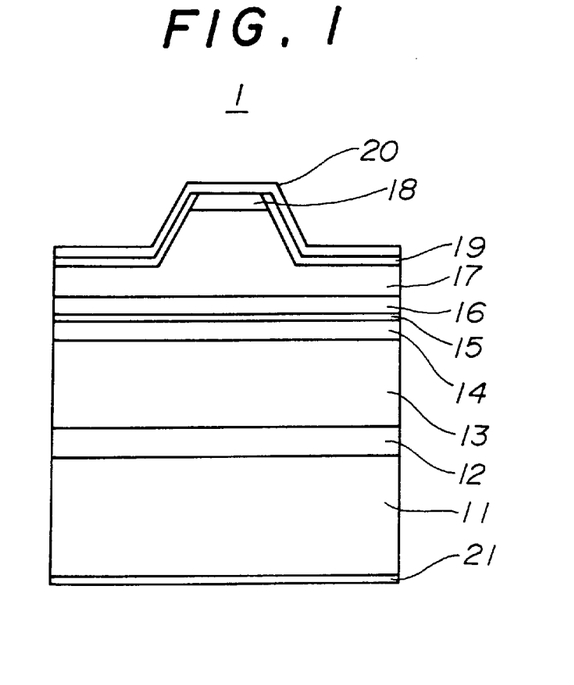
FIG. 1 is a diagram showing the construction of an edge-emission type laser diode according to a first embodiment of the present invention.

FIG. 1 shows the construction of a SCH-SQW (Separate Confinement Heterostructure Single Quantum Well) type laser diode 1 according to a first embodiment of the present invention.

Referring to FIG. 1, the laser diode 1 is constructed on a substrate 11 of n-type GaAs and includes a buffer layer 12 of n-type GaAs formed epitaxially on the substrate 11 by an MBE process with a thickness of typically about 500 nm. On the buffer layer 12, a lower cladding layer 13 of n-type AlGaAs is provided epitaxially by an MBE process with a thickness of typically about 1500 nm, and a lower optical guide layer 14 of undoped GaAs is provided further on the lower cladding layer 13 similarly by an MBE process with a thickness of typically about 100 nm.

On the lower optical guide layer 14, an active layer 15 of GaTlAs having a composition of $Tl_xGa_{1-x}As$ (0<x<1) is provided epitaxially by an MBE process with a thickness of typically about 7 nm, wherein the active layer 15 thus formed accumulates therein a compressive strain due to the increased lattice constant of GaTlAs as compared with the lattice constant of GaAs that forms the underlying optical guide layer 14. Thus, the thickness of the active layer 15 is set within a critical thickness above which dislocations develop in a strained heteroepitaxial system of GaTlAs and GaAs.

On the active layer 15, an upper optical guide layer 16 of undoped GaAs is provided epitaxially by an MBE process with a thickness of typically about 100 nm, and an upper cladding layer 17 of p-type AlGaAs is provided further on the optical guide layer 16 epitaxially by an MBE process with a thickness of typically about 1500 nm.

The upper cladding layer 17 includes a ridge structure extending in an axial direction of the laser diode, wherein the top surface of the upper cladding layer 17 including the ridge structure is covered by an $SiO_2$ film 19 except for a top region of the ridge structure, where a contact layer 18 of p-type GaAs is provided. Further, an ohmic electrode 20 of the p-type having a stacked structure of AuZn/Au is provided on the $SiO_2$ film 19 in contact with the GaAs contact layer 18. Further, an n-type electrode 21 having a stacked structure of AuGe/Ni/Au is provided on a lower major surface of the GaAs substrate 11.

In the MBE process of the epitaxial layers 12–18, metals are preferably used as a solid source of the group III elements, together with $AsH_3$ that is used as a gaseous source of As, wherein the deposition is carried out in a deposition chamber under a reduced pressure condition of typically about $1\times10^{-8}$ Pa while holding the substrate 11 at a temperature of typically about 500° C. The elemental source of Tl may be heated to a temperature of about 500° C. for producing the desired molecular beam of Tl. Otherwise, a standard MBE condition of GaAs is employed.

As already noted, TlAs is a semi-metal having a negative bandgap. Thus, the active layer 15 that contains TlAs as a component has a reduced bandgap as compared with InGaAs of the same lattice constant. Further, it should be noted that the active layer 15 of GaTlAs has a lattice constant larger than that of GaAs. Thereby, the bandgap of the active layer 15 is further reduced as a result of the compressive strain thus accumulated in the active layer 15, and a laser oscillation wavelength of 1.3 μm is easily achieved in the laser diode 1 of the present embodiment. Contrary to the present embodiment, it should be noted that the laser oscillation wavelength could not be increased beyond 1.1 μm in a conventional laser diode that uses InGaAs for the active layer 15, even when the active layer 15 is stressed.

As the laser diode 1 is constructed on a GaAs substrate, the laser diode 1 can use a widegap material such as AlGaAs for the cladding layer 13. Thereby, the band discontinuity $\Delta Ec$ of the conduction band between the active layer 15 and the cladding layer 13 is increased substantially, and the escape of the injected carriers from the active layer 15 is reduced substantially, even when the laser diode is operated at a high temperature. Thereby, the oscillation efficiency of the laser diode 1 is improved and the threshold current is reduced, without using a cooling device such as a Peltier cooler.

It should be noted that the material suitable for the cladding layer 13 of the laser diode 1 is not limited to AlGaAs noted above, but other materials such as GaInAsP or GaInP may also be used, provided that these materials establish a lattice matching with the GaAs substrate 11. Further, it should be noted that the active layer 15 may also be a mixed crystal that contains In or Al for the group III element or P for the group V element, in addition to Tl and As.

It should be noted that the active layer of GaTlAs can be used also in a single-heterojunction laser diode or in a homojunction laser diode, as well. Further, the active layer of GaTlAs is useful also in a light emitting diode.

SECOND EMBODIMENT

Figure 2:
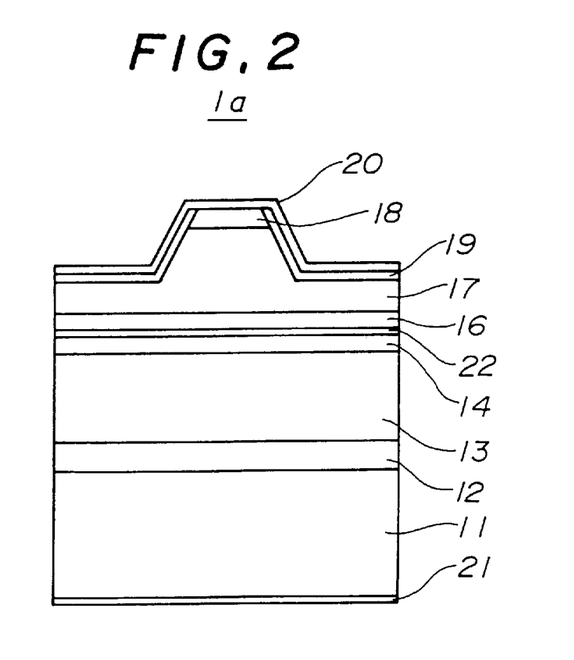
FIG. 2 is a diagram showing the construction of an edge-emission type laser diode according to a second embodiment of the present invention.

FIG. 2 shows the construction of a laser diode 1a according to a second embodiment of the present invention, wherein those parts corresponding to the parts described already are designated by the same reference numerals and the description thereof will be omitted.

Referring to FIG. 2, the laser diode 1a uses, in place of the active layer 15 of GaTlAs, an active layer 22 of TlGaNAs, in which N is added to GaTlAs with a proportion of several percent in terms of atomic fraction. The formation of the active layer 22 may be achieved by an MBE process that uses metal sources for the group III elements and $AsH_3$ for the gaseous source of As similarly as before, while plasma activated N atoms are used for the source of N.

By incorporating N into the active layer 15 of GaTlAs with a proportion of several atomic percent, the lattice constant and the bandgap of the active layer 22 thus formed are reduced. Thereby, the laser diode 1a can now successfully oscillate at the wavelength of 1.5 µm while maintaining a lattice matching between the active layer 22 and the GaAs substrate 11.

As the active layer 15 of GaTlAs has already a reduced bandgap, only a small amount of N is sufficient for reducing the bandgap of the active layer 22 in the laser diode 1a of the present embodiment. Thereby, the problem of deterioration of crystal quality, which tends to occur when a large amount of N is introduced into a GaAs crystal, is successfully avoided.

THIRD EMBODIMENT

In the foregoing embodiment, it should be noted that the active layer 22 has a lattice constant that matches the lattice constant of the GaAs substrate 11. Thus, it is no longer necessary to restrain the thickness of the active layer 22 within the critical thickness of the strained heteroepitaxial system, contrary to the case of the first embodiment.

Figure 3:
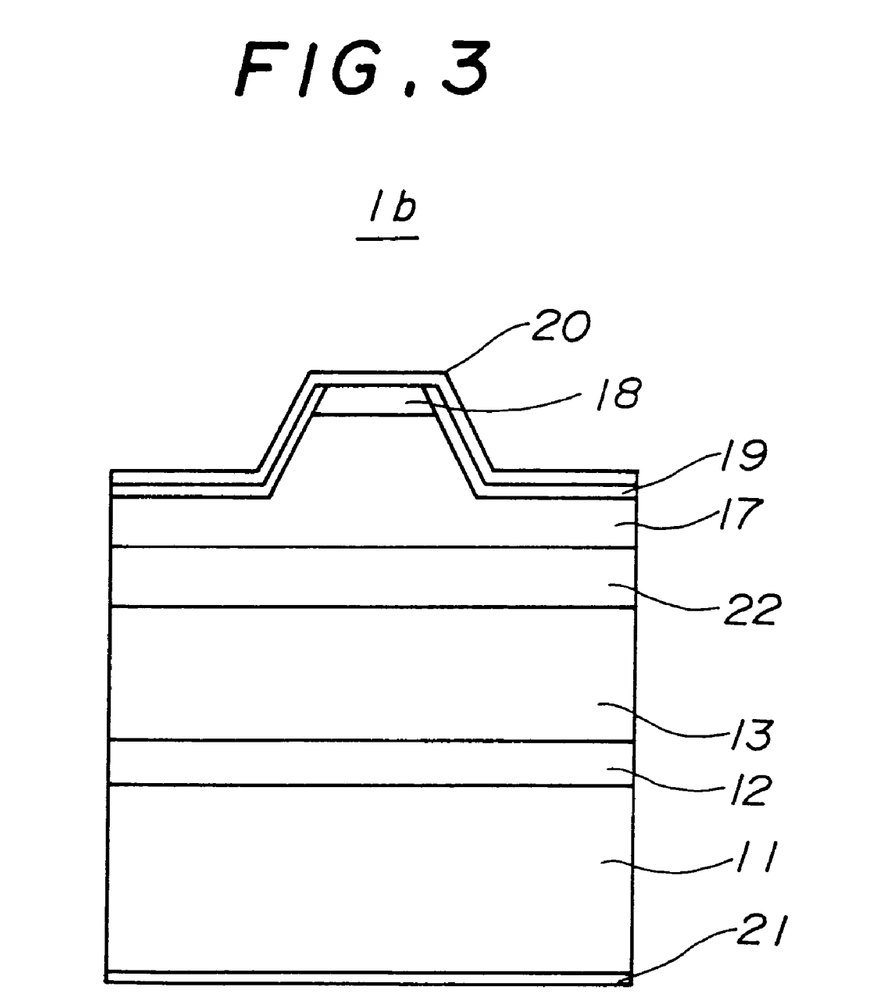
FIG. 3 is a diagram showing the construction of an edge-emission type laser diode according to a third embodiment of the present invention.

FIG. 3 shows a double-heterojunction laser diode 1b according to a third embodiment of the present invention, wherein those parts corresponding to the parts described previously are designated by the same reference numerals and the description thereof will be omitted.

Referring to FIG. 3, it should be noted that the active layer 22 of GaTlNAs has a thickness of typically about 100 nm and contacts directly with the lower cladding layer 13 and the upper cladding layer 17. Thereby, the optical guide layers 14 and 16 are eliminated. In other words, the laser diode 1b has a standard double heterojunction structure.

FOURTH EMBODIMENT

Figure 4:
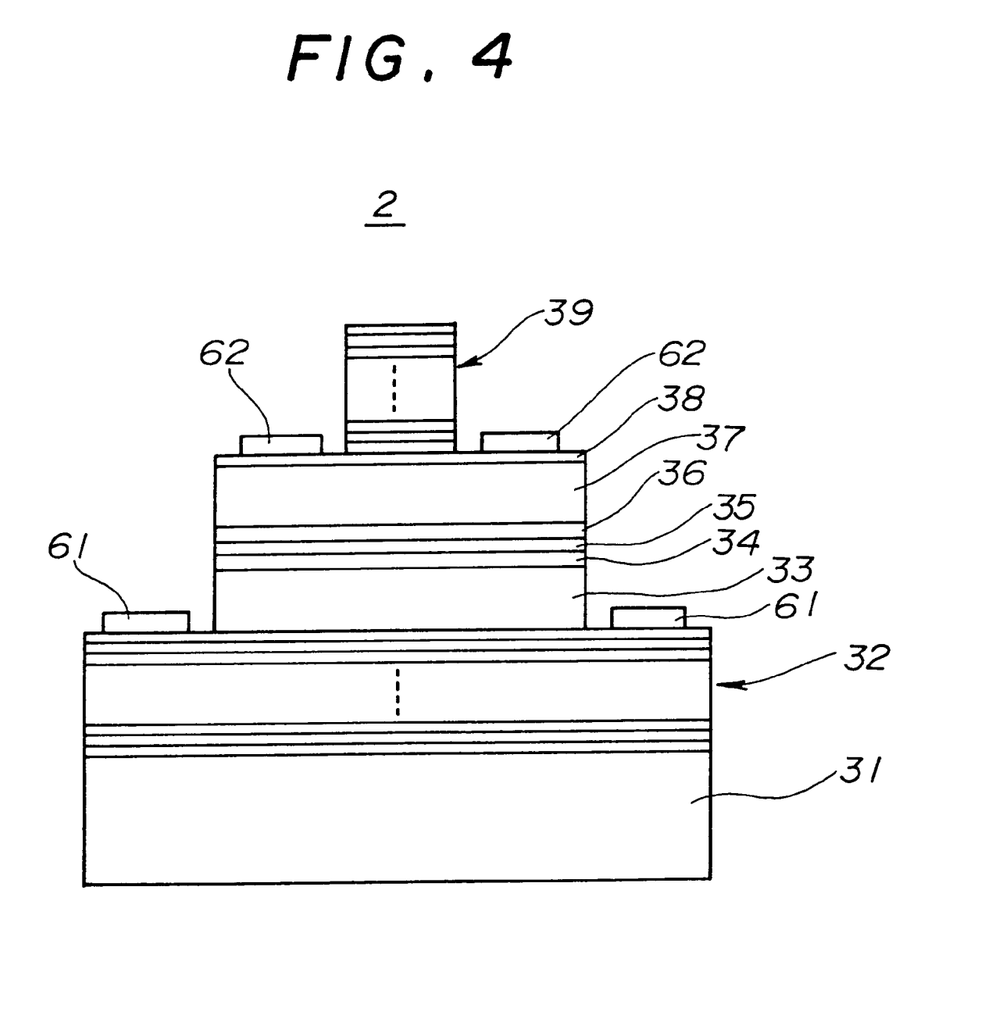
FIG. 4 is a diagram showing the construction of a vertical-cavity surface-emitting laser diode according to a fourth embodiment of the present invention.

FIG. 4 shows the construction of a vertical-cavity surface-emitting laser diode 2 according to a fourth embodiment of the present invention.

Referring to FIG. 4, the laser diode 2 is constructed on a substrate 31 of n-type GaAs on which a multilayer reflector 32 is provided in the form of an alternate repetition of an AlGaAs layer and a GaAs layer both doped to the n-type. Typically, an AlGaAs layer having a composition of AlAs and a thickness of typically about 129 nm and a GaAs layer having a thickness of typically about 109 nm are repeated alternately about 24 times in the form of epitaxial layers.

On the multilayered reflector 32, a lower cladding layer 33 of n-type AlGaAs is provided epitaxially with a thickness of typically 500 nm, and a lower optical guide layer 34 of undoped GaAs is provided on the lower cladding 33 epitaxially with a thickness of typically about 100 nm. Further, an active layer 35 of undoped GaTlAs is provided on the lower optical guide layer 34 epitaxially with a thickness of typically about 10 nm. Similarly as before, the active layer 35 is preferably formed by an MBE process that uses metal sources for the group III element.

On the active layer 35, an upper optical guide layer 36 of undoped GaAs is provided epitaxially with a thickness of typically about 100 nm, and an upper cladding layer 37 of p-type AlGaAs is provided further thereon epitaxially with a thickness of typically about 500 nm.

The upper cladding layer 37 is covered by a contact layer 38 of $p^+$-type GaAs formed epitaxially with a thickness of typically about 50 nm, and a multilayer reflector 39 having a construction substantially identical with the multilayer reflector 32 is provided further on the contact layer 38.

The layered semiconductor structure thus obtained is subjected to an etching process so as to expose a top surface of the lower multilayer reflector 32, and an n-type ohmic electrode 61 having an AuGe/Ni/Au structure is provided on the exposed top surface of the reflector 32. The upper reflector 39 is subjected to an etching process so as to expose the top surface of the contact layer 38, and a p-type ohmic electrode 62 having a Cr/Au stacked structure is provided on the exposed top surface of the contact layer 38.

In the construction of FIG. 4 in which a GaTlAs layer is used for the active layer 35 in combination with the GaAs substrate 31, it should be noted that each of the reflectors 32 and 39 includes an alternate repetition of an AlGaAs layer and a GaAs layer as noted before. Thereby, a large reflectance of as much as 99.9% is guaranteed while simultaneously maintaining a lattice matching with the GaAs substrate. In the conventional vertical-cavity surface-emitting laser diode for use in the 1500 nm band, on the other hand, it has been necessary to use a multilayered reflector structure formed by an alternate stacking of an InP layer and an InGaAsP layer for maintaining a lattice matching with an InP substrate used for carrying an InGaAs active layer, while the stacking of such an InP layer and an InGaAsP layer provides a refractive index change of only 25%.

In the present embodiment, therefore, the number of stacked layers in the multilayer reflector 32 or 39 can be reduced, and the fabrication process of the laser diode 2 is substantially simplified. In addition, it should be noted that the laser diode 2 is advantageous in the point that a large band discontinuity ΔEc is obtained in the conduction band between the active layer 35 and the cladding layer 33 or 37, similarly to the previous embodiments. Thereby, an efficient and stable laser oscillation can be achieved even at a high temperature environment, without using a cooling device.

FIFTH EMBODIMENT

Figure 5:
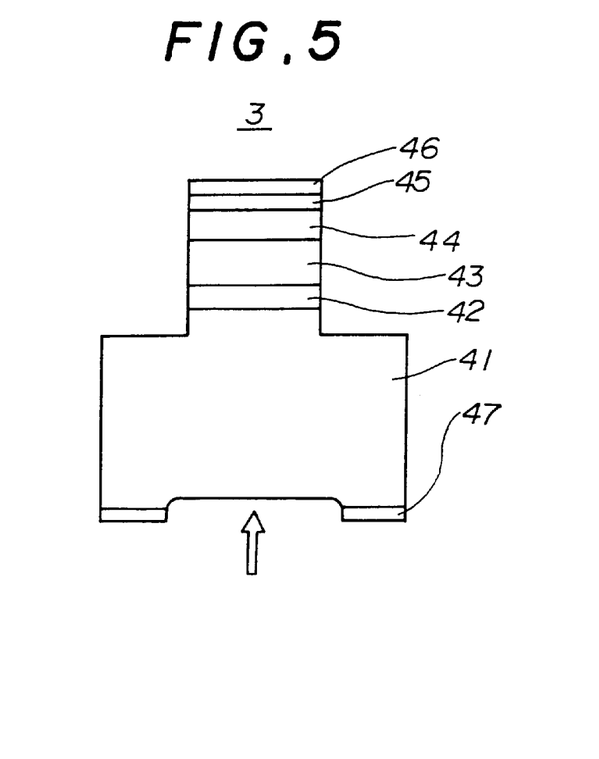
FIG. 5 is a diagram showing the construction of a photodiode according to a fifth embodiment of the present invention.

FIG. 5 shows the construction of a photodiode 3 according to a fifth embodiment of the present invention.

Referring to FIG. 5, the photodiode 3 is constructed on a substrate 41 of n-type GaAs and includes a buffer layer 42 of n-type AlGaAs formed on the substrate 41 epitaxially with a thickness of typically about 1000 nm, on which an optical absorption layer 43 of undoped GaTlNAs is provided epitaxially. The optical absorption layer 43 has a composition set so as to establish a lattice matching with the GaAs substrate 41 and is formed with a relatively large thickness of about 2000 nm.

On the optical absorption layer 43, a p-type GaTlNAs layer 44 is provided epitaxially with a thickness of typically about 1000 nm, and a cap layer 45 of p-type GaAs is provided further thereon epitaxially with a thickness of typically about 500 nm. The cap layer 45 is covered by a p-type electrode 46, and an n-type electrode 47 is provided on the bottom surface of the substrate 41. The electrode 47 is formed with a window for allowing an incident optical beam incident to the substrate 41 from a lower side, to reach the optical absorption layer 43. It should be noted that GaAs forming the substrate 41 or the buffer layer 42 is transparent to an optical radiation having a wavelength of 0.9 μm or longer.

In the present embodiment, the optical absorption layer 43 has a bandgap corresponding to the 1.3 μm or 1.5 μm wavelength, and thus, the photodiode 3 is effective for detecting an optical beam that has been transmitted via an optical fiber. As the optical absorption layer 43 has a composition that achieves a lattice matching with the substrate 41 as noted before, it becomes possible to increase the thickness of the optical absorption layer 43 as desired, and an efficient and high sensitivity optical detection becomes possible.

SIXTH EMBODIMENT

Figure 6:
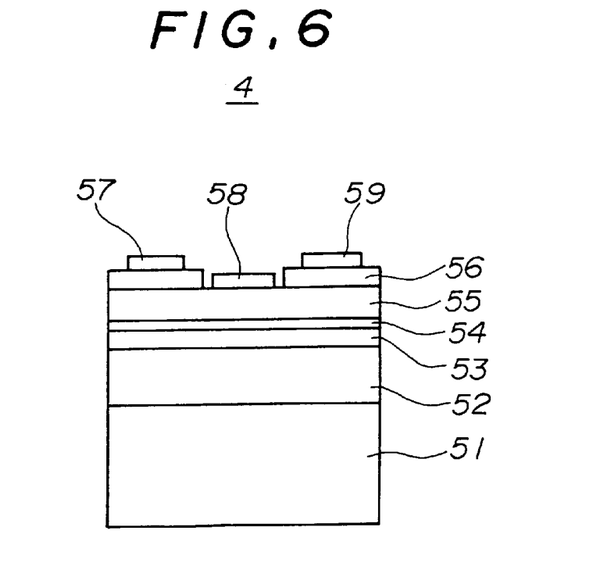
FIG. 6 is a diagram showing the construction of a HEMT according to a sixth embodiment of the present invention.

FIG. 6 shows the construction of a HEMT 4 according to a sixth embodiment of the present invention.

Referring to FIG. 6, the HEMT 4 is constructed on a semi-insulating GaAs substrate 51 and includes a buffer layer 52 of undoped GaAs formed epitaxially on the GaAs substrate 51 with a thickness of typically about 1000 nm.

On the buffer layer 52, a channel layer 53 of undoped GaTlAs is formed epitaxially typically with a thickness of about 10 nm, and an electron supplying layer 55 of n-type GaAs is provided on the channel layer 53, with an intervening spacer layer 54, wherein the spacer layer 54 is formed epitaxially with a thickness of typically about 3 nm while the electron supplying layer 55 is formed also epitaxially with a thickness of typically about 30 nm.

Further, a gate electrode 58 is provided on the electron supplying layer 55 in correspondence to the channel region of the HEMT to be formed, and a pair of cap layers 56 of p-type GaAs are provided on the electron supplying layer 55 at both sides of the gate electrode 58. Further, a source electrode 57 is provided on the cap layer 56 covering the source region of the HEMT and a drain electrode 59 is provided on the cap layer 56 that covers the drain region of the HEMT.

According to the HEMT of the present embodiment, it should be noted that the electron supplying layer 55 can be formed of the same material forming the substrate 51, while simultaneously securing a large band discontinuity at the heterojunction interface between the electron supplying layer 55 (and hence the space layer 54) and the channel layer 53. Thereby, the electron supplying layer 55 establishes a lattice matching with the substrate 51, and thus, it becomes possible to form the electron supplying layer 55 with a high crystal quality.

It should be noted that the channel layer 53 of GaTlAs has a band gap far smaller than the bandgap of the electron supplying layer 55 of GaAs, and a large band discontinuity is realized between the electron supplying layer 55 and the channel layer 53 as already noted. Thereby, a two-dimensional electron gas is formed in the channel layer 53 along an upper major surface thereof, with a high electron sheet density. The HEMT 4 thereby shows an excellent high-speed operational characteristic due to the large electron mobility in the GaTlAs crystal used for the channel layer 53. In operation, the HEMT 4 injects electrons into the two-dimensional electron gas in the channel layer 53 via the source electrode 57 and the cap layer 56 wherein the electrons thus injected are collected by the drain electrode 59 after passing through the channel region along the two-dimensional electron gas. Thereby, the flow of the electrons through the channel region is controlled by a control voltage applied to the gate electrode 58.

As the channel layer 53 of the HEMT 4 forms a strained heteroepitaxial system with the substrate 51 and hence with the electron supplying layer 55, the foregoing thickness of the channel layer 53 is set within the critical thickness above which dislocations would develop in the channel layer 53.

Further, the present invention is by no means limited to the embodiments described heretofore, but various variations and modifications may be made without departing from the scope of the invention.

What is claimed is:

1. A compound semiconductor device, comprising:
   a GaAs substrate; and
   a group III-V compound semiconductor layer provided on said GaAs substrate, said group III-V compound semiconductor layer containing As as a group V element and Tl as a group III element.

2. A compound semiconductor device as claimed in claim 1, wherein said group III-V compound semiconductor layer has a composition $Tl_xGa_{1-x}As$ (0<x<1).

3. A compound semiconductor device as claimed in claim 1, wherein said group III-V compound semiconductor layer further contains N as a group V element.

4. A light-emitting optical semiconductor device, comprising:
   a GaAs substrate;
   an active layer of a group III-V compound semiconductor layer containing As as a group V element and Tl as a group III element, said active layer being provided on said GaAs substrate;
   an upper cladding layer provided on said active layer, said upper cladding layer having a composition selected such that said upper cladding layer establishes a lattice matching with said substrate, said upper cladding layer being selected from a group consisting of: AlGaAs, InGaAsP and InGaP;
   a lower cladding layer provided on said GaAs substrate but below said active layer, said lower cladding layer having a composition selected such that said lower cladding layer establishes a lattice matching with said substrate, said lower cladding layer being selected from a group consisting of: AlGaAs, InGaAsP and InGaP;
   a first electrode provided on said upper cladding layer for injecting carriers of a first polarity into said active layer via said upper cladding layer; and
   a lower electrode provided on said GaAs substrate for injecting carriers of a second, opposite polarity into said active layer via said lower cladding layer.

5. A compound semiconductor device as claimed in claim 4, wherein said group III-V compound semiconductor layer has a composition $Tl_xGa_{1-x}As$ (0<x<1).

6. A compound semiconductor device as claimed in claim 4, wherein said group III-V compound semiconductor layer further contains N as a group V element.

7. A double-hetero laser diode, comprising:
   a GaAs substrate;
   an active layer of a group III-V compound semiconductor layer containing As and N as a group V element and Tl as a group III element, said active layer being provided on said GaAs substrate and having a composition set such that a lattice matching is achieved with said GaAs substrate;

an upper cladding layer provided on said active layer in contact therewith, said upper cladding layer having a composition selected such that said upper cladding layer establishes a lattice matching with said substrate, said upper cladding layer being selected from a group consisting of: AlGaAs, InGaAsP and InGaP;

a lower cladding layer provided on said GaAs substrate but below said active layer in contact with said active layer, said lower cladding layer having a composition selected such that said lower cladding layer establishes a lattice matching with said substrate, said lower cladding layer being selected from a group consisting of: AlGaAs, InGaAsP and InGaP;

a first electrode provided on said upper cladding layer for injecting carriers of a first polarity into said active layer via said upper cladding layer; and a lower electrode provided on said GaAs substrate for injecting carriers of a second, opposite polarity into said active layer via said lower cladding layer.

8. A vertical-cavity surface-emitting laser diode, comprising:

a GaAs substrate;

a lower multilayer reflector provided on said GaAs substrate, said lower multilayer reflector comprising an alternate repetition of a GaAs layer and an AlGaAs layer;

an active layer of a group III-V compound semiconductor layer containing As as a group V element and Tl as a group III element, said active layer being provided on said lower multilayer reflector;

an upper cladding layer provided on said active layer, said upper cladding layer having a composition selected such that said upper cladding layer establishes a lattice matching with said substrate, said upper cladding layer being selected from a group consisting of: AlGaAs, InGaAsP and InGaP;

a lower cladding layer provided on said lower multilayer reflector but below said active layer, said lower cladding layer having a composition selected such that said lower cladding layer establishes a lattice matching with said substrate, said lower cladding layer being selected from a group consisting of: AlGaAs, InGaAsP and InGaP;

an upper multilayer reflector provided on upper cladding layer, said upper multilayer reflector comprising an alternate repetition of a GaAs layer and an AlGaAs layer;

an upper ohmic electrode provided in electrical contact with said upper cladding layer for injecting carriers of a first polarity to said active layer via said upper cladding layer; and a lower ohmic electrode provided in electrical contact with said lower cladding layer for injecting carriers of a second, opposite polarity to said active layer via said lower cladding layer.

9. A photodiode, comprising:

a GaAs substrate;

a photo-absorption layer of a group III-V compound semiconductor material containing therein TlAs and N, said photo-absorption layer being provided on said substrate with a lattice matching therewith;

a first electrode provided on said substrate, said first electrode including a window for exposing a surface of said substrate; and a second electrode provided on said photo-absorption layer.

10. A high-speed compound semiconductor device that includes an active layer of a group III-V compound semiconductor material containing therein Tl as a group III element, wherein said active layer includes a two-dimensional electron gas formed therein.

11. A high-speed compound semiconductor device, comprising:

a GaAs substrate;

a channel layer of a group III-V compound semiconductor material containing therein Tl as a group III element and As as a group V element;

source electrode means for injecting carriers into said channel layer;

drain electrode means for collecting carriers from said channel layer; and gate control means controlling a flow of said carriers in said channel layer from said source electrode means to said drain electrode means.

* * * * *